(12) United States Patent
Ohtake (10) Patent No.: US 7,869,290 B2
(45) Date of Patent: Jan. 11, 2011

(54) NAND-TYPE FLASH MEMORY AND SEMICONDUCTOR MEMORY DEVICE

(75) Inventor: Hiroyuki Ohtake, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 194 days.

(21) Appl. No.: 12/333,487

(22) Filed: Dec. 12, 2008

(65) Prior Publication Data
US 2009/0154243 A1 Jun. 18, 2009

(30) Foreign Application Priority Data
Dec. 13, 2007 (JP) ............................. 2007-322182

(51) Int. Cl.
*G11C 7/00* (2006.01)
*G11C 11/34* (2006.01)
(52) U.S. Cl. .................. 365/201; 365/185.17
(58) Field of Classification Search .............. 365/201, 365/185.17, 185.33
See application file for complete search history.

(56) References Cited

U.S. PATENT DOCUMENTS

| | | | | |
|---|---|---|---|---|
| 5,469,444 A | | 11/1995 | Endoh et al. | |
| 5,689,463 A | * | 11/1997 | Murakami et al. | 365/200 |
| 6,704,223 B2 | | 3/2004 | Hosono et al. | |
| 7,031,190 B2 | * | 4/2006 | Lee | 365/185.17 |
| 7,180,786 B2 | * | 2/2007 | Mastrangelo et al. | 365/185.23 |
| 7,200,058 B2 | * | 4/2007 | Mochizuki | 365/201 |

FOREIGN PATENT DOCUMENTS

JP 10-12000 1/1998

* cited by examiner

*Primary Examiner*—Anh Phung
(74) *Attorney, Agent, or Firm*—Oblon, Spivak, McClelland, Maier & Neustadt, L.L.P.

(57) ABSTRACT

A NAND-type flash memory has a memory cell array having NAND cells, each having memory cells capable of being rewritten electrically, a drain of one memory cell and a source of the other memory cell neighboring in a first direction being connected to each other, each of the NAND cells being arranged in a second direction, a plurality of bit lines, each being provided for each of the NAND cells, a plurality of sense amplifiers, each being provided for each of the bit lines, a plurality of data latch circuits, each being provided for each of the sense amplifiers, each of the data latch circuits temporarily holding data sent to and received from the corresponding sense amplifier, at least one test latch circuit which temporarily holds test data supplied from outside, and a data switching circuit which performs control for supplying at least two among the data latch circuits with data held in the test latch circuit.

20 Claims, 7 Drawing Sheets

F I G. 7

NAND-TYPE FLASH MEMORY AND SEMICONDUCTOR MEMORY DEVICE

CROSS REFERENCE TO RELATED APPLICATIONS

This application is based upon and claims the benefit of priority from the prior Japanese Patent Application No. 2007-322182, filed on Dec. 13, 2007, the entire contents of which are incorporated herein by reference.

BACKGROUND OF THE INVENTION

1. Field of the Invention

The present invention relates to a NAND-type flash memory having a plurality of NAND cells.

2. Related Art

Miniaturization of NAND-type flash memories has been steadily developed. In the inspection processes at the time of manufacturing, it is indispensable, in order to secure reliability, to perform a data pattern test in the direction in which bit lines are arranged, and a data pattern test in the direction in which sense amplifiers are arranged (see Japanese Patent Laid-Open Pub. No. 10-12000). In these tests, it is necessary to input various data patterns.

Conventionally, DataIn command indicative of a data input is used to transfer all of the test pattern data to data latch circuits which are adjacent to sense amplifiers.

In such a test technique, there is a problem that it takes time to input data when performing the test on different pages in a memory cell array, since it is necessary to input data on each occasion even when the same data pattern is required.

In the case where a tester is used to perform the test, the number of pins which can be used in measurement is limited in the tester. Accordingly, in general, the tester is set in a special mode to reduce the number of pins used for one chip of a test object in order to increase the number of chips which can be measured at the same time.

In such a special mode, although the number of pins used for one chip can be reduced, many clocks are needed to input commands used in the test and to input test data patterns, by which the test time is lengthened.

In the case where a sense amplifier is arranged for each bit line, potential interference is easily caused between the bit lines since the potential on each bit line changes at the same time. Accordingly, when performing the test, it is necessary to supply, to the bit lines, data patterns corresponding to the combination of the potentials on the bit lines, by which the kinds of data patterns are increased. In the conventional techniques, there is a problem that when the kinds of data patterns are increased, it takes a considerable time only to input data, by which the test time is lengthened.

SUMMARY OF THE INVENTION

According to one aspect of the present invention, a NAND-type flash memory comprising:

a memory cell array having NAND cells, each having memory cells capable of being rewritten electrically, a drain of one memory cell and a source of the other memory cell neighboring in a first direction being connected to each other, each of the NAND cells being arranged in a second direction;

a plurality of bit lines, each being provided for each of the NAND cells;

a plurality of sense amplifiers, each being provided for each of the bit lines;

a plurality of data latch circuits, each being provided for each of the sense amplifiers, each of the data latch circuits temporarily holding data sent to and received from the corresponding sense amplifier;

at least one test latch circuit which temporarily holds test data supplied from outside; and a data switching circuit which performs control for supplying at least two among the data latch circuits with data held in the test latch circuit.

According to the other aspect of the present invention, a semiconductor memory device comprising:

a memory cell array having a plurality of memory cells;

a plurality of bit lines connected to the plurality of memory cells;

a plurality of sense amplifiers, each being provided for each of the bit lines;

a plurality of data latch circuits, each being provided for each of the sense amplifiers, each of the data latch circuits temporarily holding data sent to and received from the corresponding sense amplifier;

at least one test latch circuit which temporarily holds test data supplied from outside; and a data switching circuit which performs control for supplying at least two among the data latch circuits with data held in the test latch circuit.

DETAILED DESCRIPTION OF THE INVENTION

Hereinafter, embodiments of the present invention will be explained referring to the drawings.

First Embodiment

Figure 1:
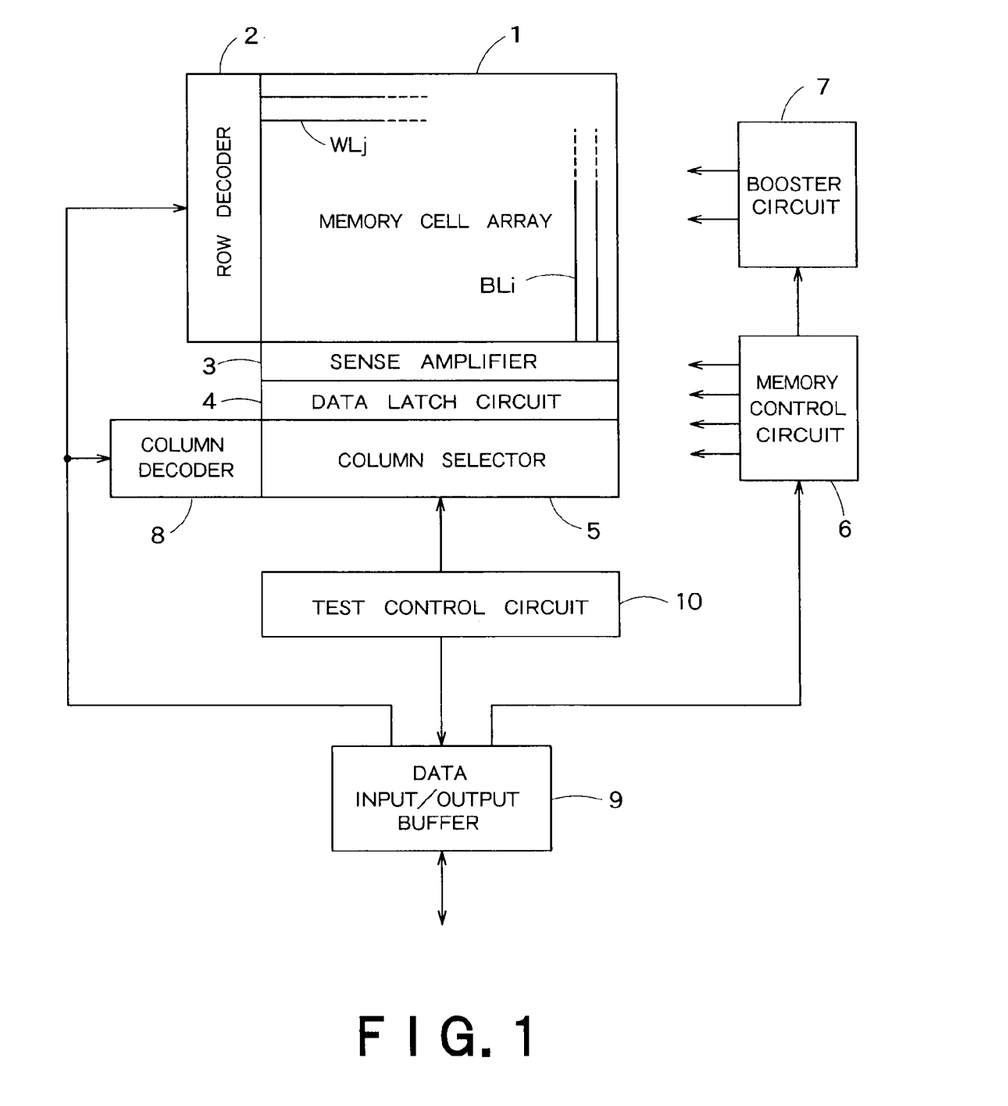
FIG. 1 is a block diagram showing a schematic structure of a NAND-type flash memory according to a first embodiment of the present invention.

FIG. 1 is a block diagram showing a schematic structure of a NAND-type flash memory according to the first embodiment of the present invention. A NAND-type flash memory in FIG. 1 has: a memory cell array 1 having a plurality of memory cells which can be electrically rewritten and are arranged in a matrix shape; a row decoder 2 for driving word lines arranged in a row direction; sense amplifiers 3 for sensing the potentials of bit lines arranged in a column direction; data latch circuits 4 connected to the sense amplifiers 3; column selectors 5 for selecting the bit lines; a memory control circuit 6 for controlling writing, erasing, and reading of data; a booster circuit 7 for generating a voltage used for writing, reading, etc. of data; a column decoder 8 for controlling the column selectors 5; a data input/output buffer 9; and a test control circuit 10, which is one of characteristic features of the first embodiment.

Figure 2:
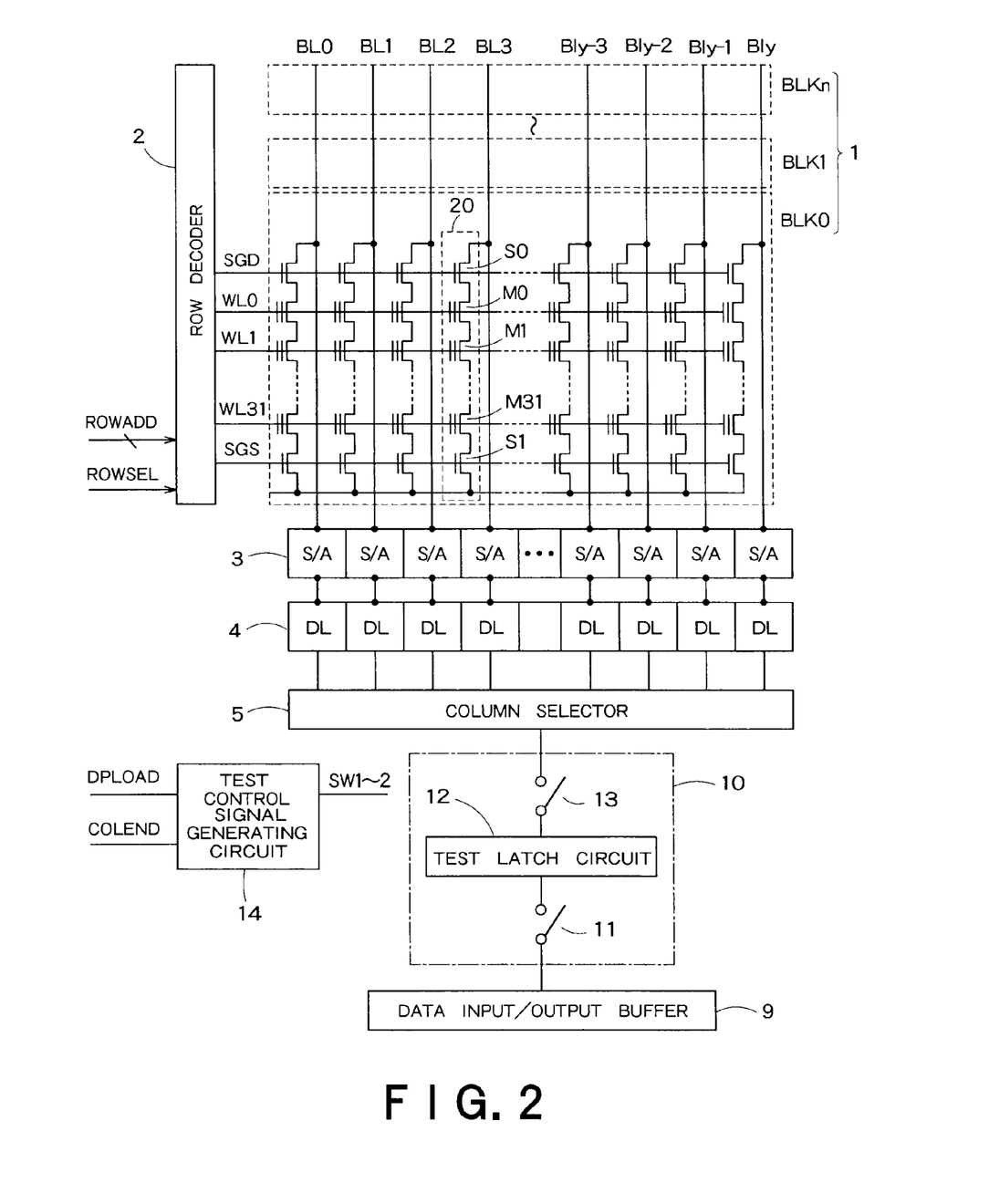
FIG. 2 is a block diagram showing a structure of a memory cell array 1.

FIG. 2 is a block diagram showing a structure of the memory cell array 1. As shown in FIG. 2, the memory cell array 1 has NAND cells (memory cell group), in which a drain of one memory cell and a source of the other memory cell neighboring in a row direction are connected to each other. Each of the NAND cells is arranged in a column direction.

One NAND cell has memory cells of 32 bits, for example. These memory cells form a unit for performing a mass erase operation. Hereinafter, the unit is referred to as a block. A plurality of blocks are arranged in the row direction in the memory cell array 1.

A selection transistor S0 is connected between one end of each NAND cell and the corresponding bit line, while a selection transistor S1 is connected between the other end of each NAND cell and the corresponding source line. A NAND cell unit 20 is formed of the NAND cell and the selection transistors S0 and S1.

The sense amplifier 3 is arranged corresponding to each bit line. The sense amplifier 3 senses the data of the bit line when reading data, and temporarily holds the data supplied from the outside when writing data. Further, the sense amplifier 3 selectively supplies a predetermined voltage to the bit line when writing and erasing data.

The data latch circuit 4 is arranged corresponding to each sense amplifier 3, and temporarily holds (latches) data to be supplied to the corresponding sense amplifier 3. The data latch circuit 4 is connected to the column selector 5.

The test control circuit 10 is arranged between the column selectors 5 and the data input/output buffer 9. The test control circuit 10 has a first switching circuit 11, a test latch circuit 12, a second switching circuit 13, and a test control signal generating circuit 14. The first switching circuit 11 and the second switching circuit 13 operate asynchronously with each other. The second switching circuit 13 operates synchronously with the column selectors 5. As shown in FIG. 2, the test control signal generating circuit 14 may be provided separately from the test control circuit 10.

Each of the first switching circuit 11 and the second switching circuit 13 performs a switching control based on a control signal from the test control signal generating circuit 14. Inputs to the test control signal generating circuit 14 are a command signal DPLOAD indicative of the latch (load) of a data pattern, and a signal COLEND indicative of the number of columns that should be tested. Based on the signals, the test control signal generating circuit 14 generates a signal for performing a switching control over the first switching circuit 11, and a signal for performing a switching control over the second switching circuit 13.

The test latch circuit 12 temporarily holds a test data pattern input through the data input/output buffer 9. The test control signal generating circuit 14 controls the switching timing of each of the first switching circuit 11 and the second switching circuit 13.

Figure 3:
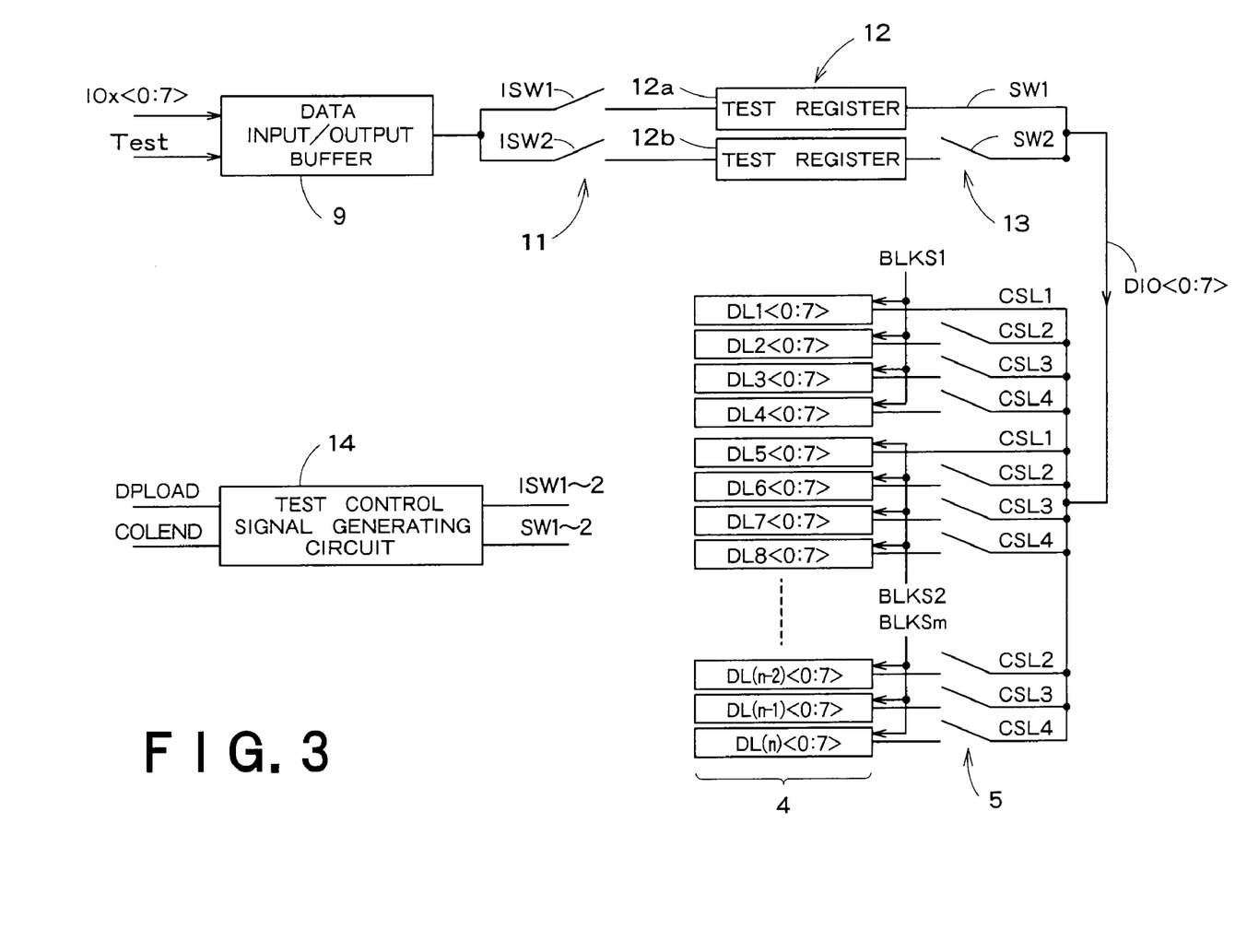
FIG. 3 is a block diagram showing a detailed peripheral structure of a test control circuit 10.

FIG. 3 is a block diagram showing a detailed peripheral structure of the test control circuit 10. In FIG. 3, the test latch circuit 12 has two test registers 12a and 12b. The first switching circuit 11 selects either of the two test registers 12a and 12b. Selected test register temporarily holds a test data pattern. When data are held in the two test registers 12a and 12b, the second switching circuit 13 selects either of the registers to supply the data to the column selectors 5.

The second switching circuit 13 and the column selectors 5 operate simultaneously with each other. The data in the test register selected by the second switching circuit 13 are held in the corresponding data latch circuit 4.

In the first embodiment, it is premised that the same data in the same test register are held in a plurality of data latch circuits 4. Accordingly, it is not necessary to supply the data from the data input/output buffer 9 on each occasion, by which the data input time can be shortened.

Figure 4:
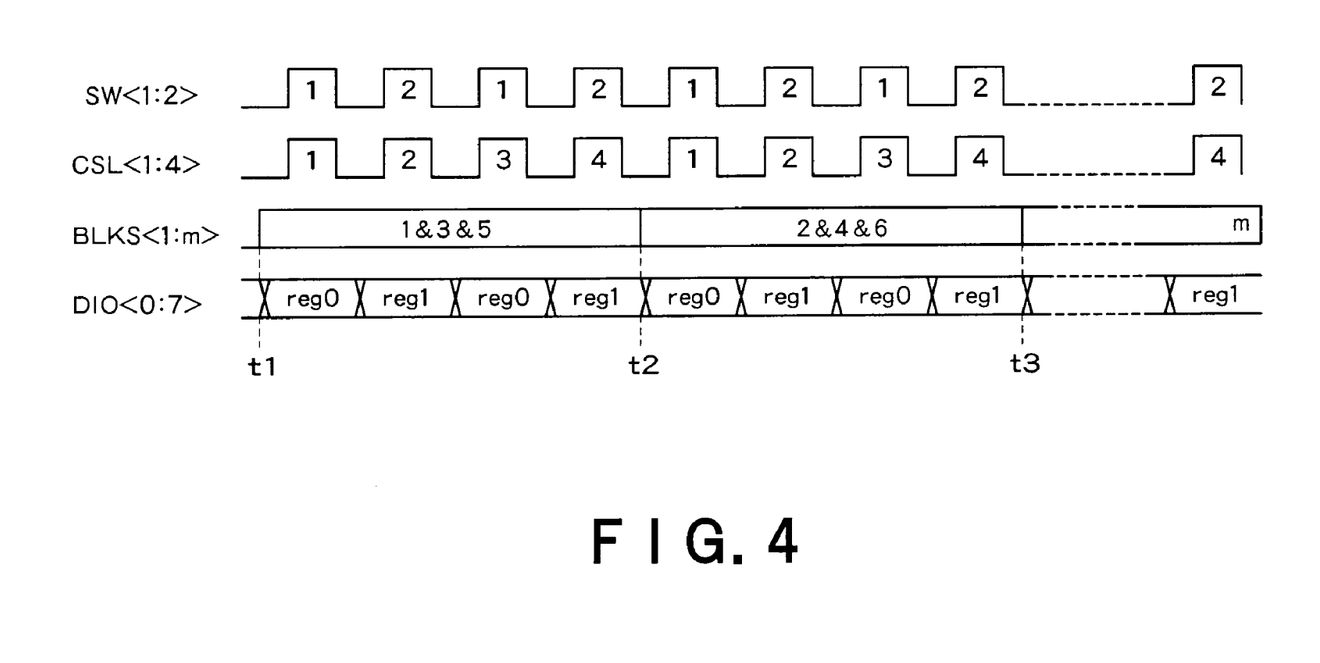
FIG. 4 is a timing diagram showing an operation of the test control circuit 10 in FIG. 3.

FIG. 4 is a timing diagram showing an operation of the test control circuit 10 in FIG. 3. First, the test control circuit 10 alternately switches the first switching circuit 11 so that the two test latch circuits 12a and 12b latch the data patterns which are different from each other.

Next, in the state where a block 1 in the memory cell array 1 is selected, the second switching circuit 13 is alternately switched to sequentially select the column selectors 5 (CSL<1:4>) in synchronization with the switching timing. Accordingly, the same data as the data latched in the test latch circuit 12 are latched in the two data latch circuits 4 which are corresponding to the column selectors 5 (CSL1, CSL3) in the block 1, while the same data as the data latched in the test latch circuit 12 are latched in the two data latch circuits 4 which are corresponding to the column selectors 5 (CSL2, CSL4). After that, with respect to a block 2 and the following blocks, the same data as the data latched in the test latch circuit 12 are latched in the data latch circuits 4 similarly. Alternatively, the data from the test latch circuit 12 may be latched in the data latch circuits 4 at the same position in a plurality of blocks in parallel.

In FIG. 4, with respect to the block 1, a block 3, and a block 5, the data transfers to the data latch circuits 4 are performed at the same time (from a time t1 to a time t2), by which the data from the same test latch circuit 12 are latched in the data latch circuits 4 which are present at the same positions in the blocks 1, 3, and 5. Further, with respect to the block 2, a block 4, and a block 6, the data transfers to the data latch circuits 4 are performed at the same time (from the time t2 to a time t3), by which the data from the same test latch circuit 12 are latched in the data latch circuits 4 which are present at the same positions in the blocks 2, 4, and 6.

In the first embodiment, when latching the same data to different data latch circuits 4, the same data latched in the test latch circuit 12 are used, by which it is not necessary to input the data pattern from the outside every time when latching data in different data latch circuits 4, and the data input time can be shortened.

In FIG. 4, the data latched in the data latch circuits 4 which are corresponding to the adjacent column selectors 5 are different from each other, as an example. However, the data to be latched in the data latch circuits 4 are not limited to the example as shown in FIG. 4.

As stated above, arranged in the first embodiment are two test latch circuits 12 for latching two kinds of test data patterns, and the second switching circuit 13 connected between the two test latch circuits 12 and the column selectors 5. Accordingly, when latching the same test data pattern in a different data latch circuits 4, the data pattern is transferred from the test latch circuit 12 to the data latch circuits 4 without being input from the outside on each occasion, by which it is possible to drastically reduce the time for latching the test data patterns in the data latch circuits 4, and also to shorten the test time. The first embodiment is largely effective, in particular, when the number of data patterns that should be tested is large.

Second Embodiment

In a second embodiment, the number of the test latch circuits 12 is increased, compared with the first embodiment.

Figure 5:
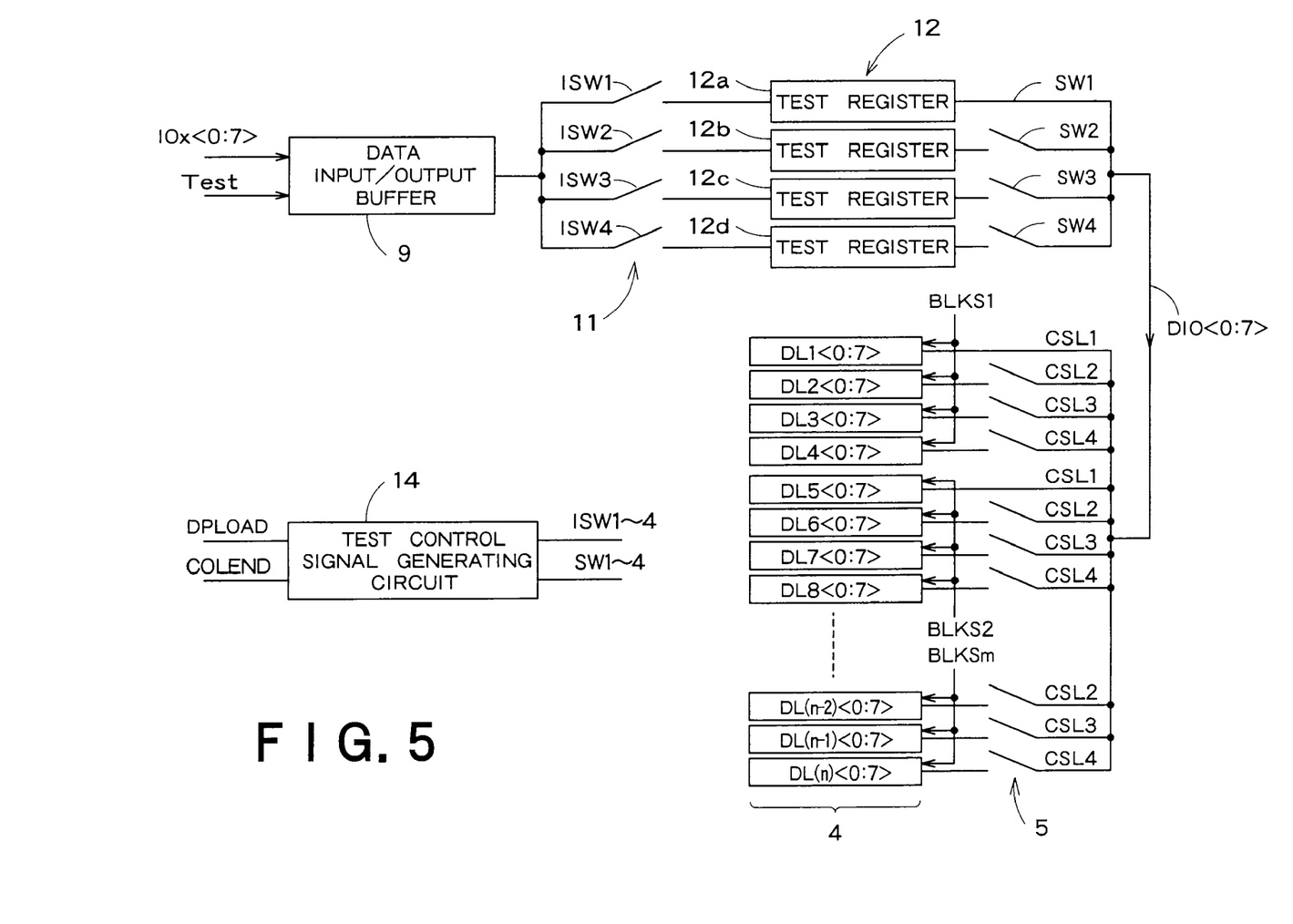
FIG. 5 is a block diagram showing a detailed peripheral structure of the test control circuit 10 according to a second embodiment of the present invention.

FIG. 5 is a block diagram showing a detailed peripheral structure of the test control circuit 10 according to the second embodiment of the present invention. In FIG. 5, the same numerals are used to denote the structural portions which are common to FIG. 3. The differences between the first embodiment and the second embodiment are mainly explained in the following.

In FIG. 5, the test latch circuit 12 in the test control circuit 10 has four test registers 12a, 12b, 12c, and 12d. The first switching circuit 11 selects any one of the four test registers 12a, 12b, 12c, and 12d. Selected test register temporarily holds (latches) a test data pattern from the data input/output buffer 9. Each of the four test registers 12a, 12b, 12c, and 12d lathes a different data pattern.

Figure 6:
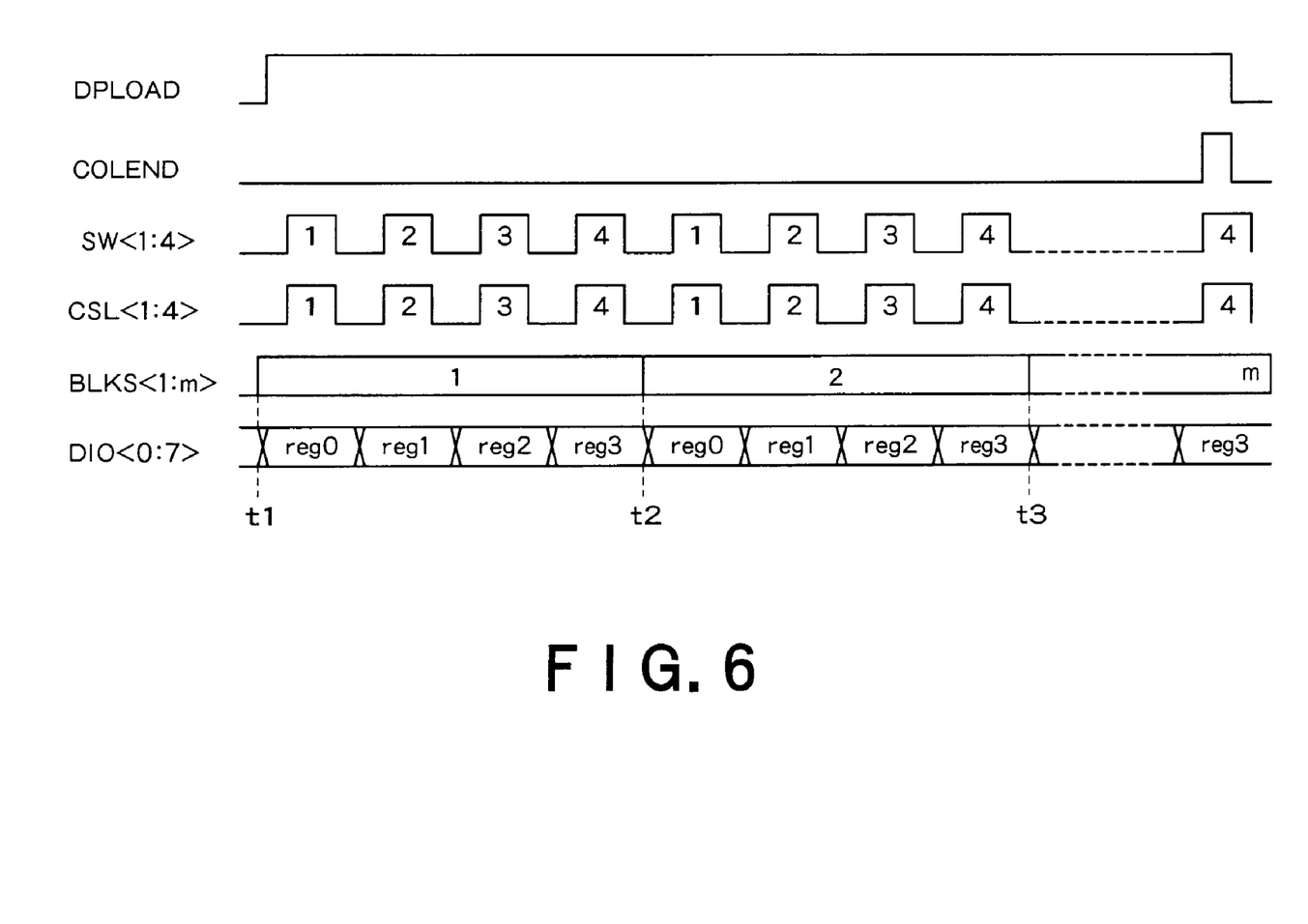
FIG. 6 is a timing diagram showing an operation of the test control circuit 10 in FIG. 5.

FIG. 6 is a timing diagram showing an operation of the test control circuit 10 in FIG. 5. As shown in FIG. 6, in synchronization with the switching timing of the second switching circuit 13, the column selectors 5 (CSL<1:4>) are sequentially selected. Accordingly, the same data as the data latched in the test latch circuit 12a are latched in the data latch circuit 4 which is corresponding to the column selector 5 (CSL1) in the block 1. Similarly, the same data as the data latched in the test latch circuits 12b to 12d are latched in the data latch circuits 4 which are corresponding to the column selectors 5 (CSL<2:4>), respectively.

After the data transfer to the data latch circuits 4 in the block 1 is finished (at the time t2), then the data transfer to the data latch circuits 4 in the block 2 is performed (from the time t2 to time t3). Afterward, the data transfer is performed on each block.

As stated above, in the second embodiment, four kinds of data patterns can be quickly latched in the data latch circuits 4, by which the data input time can be drastically reduced compared to the case where the data pattern is input from the outside on each occasion.

Third Embodiment

In a third embodiment, the test latch circuit 12 has a shift register formed of registers which are connected in a ring shape.

Figure 7:
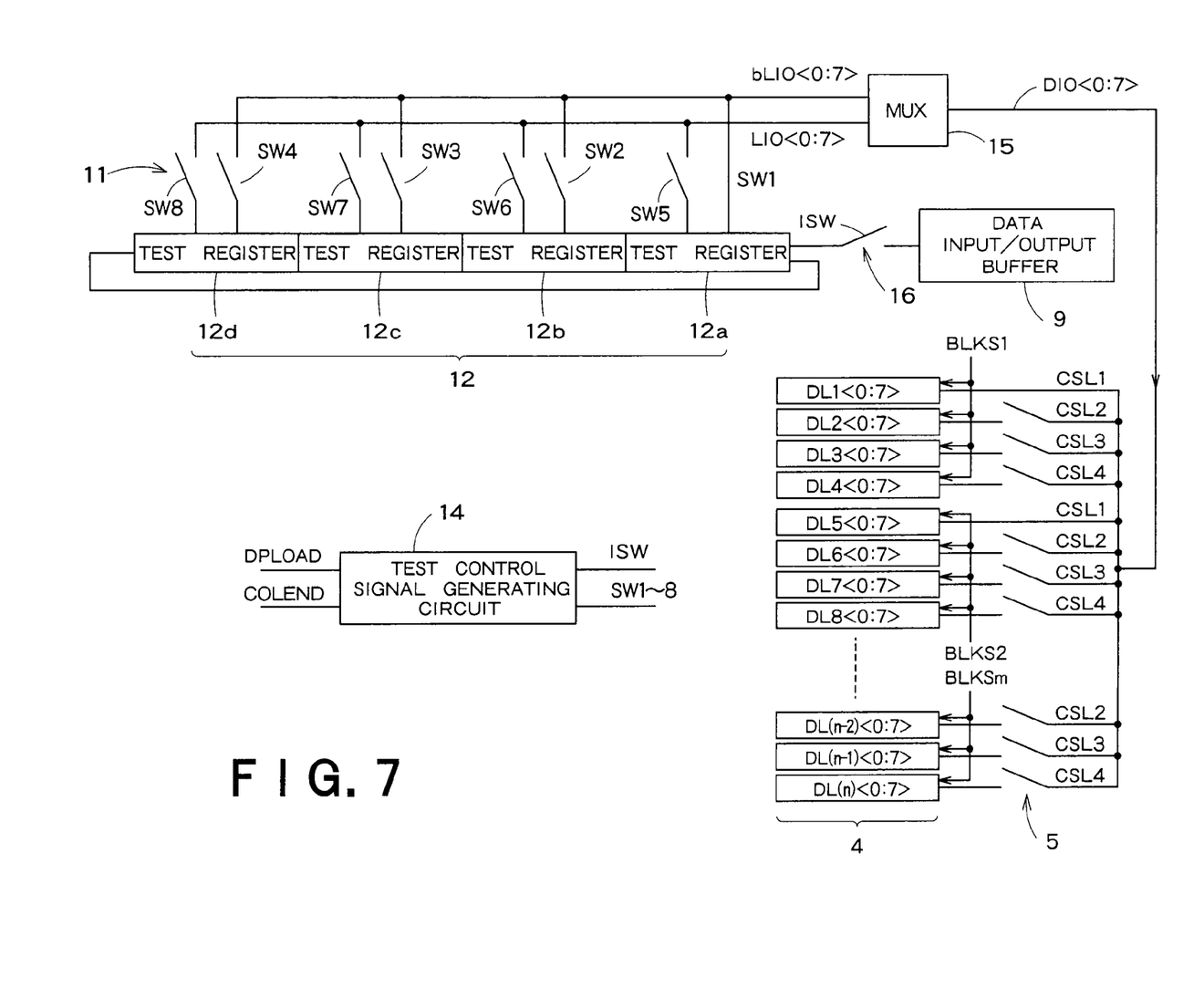
FIG. 7 is a block diagram showing a detailed peripheral structure of the test control circuit 10 according to a third embodiment of the present invention.

FIG. 7 is a block diagram showing a detailed peripheral structure of the test control circuit 10 according to the third embodiment of the present invention. In FIG. 7, the internal structure of the test latch circuit 12 is different from that in each of FIG. 3 and FIG. 5. The test latch circuit 12 in FIG. 7 has a shift register formed of four test registers 12a, 12b, 12c, and 12d, which are connected in a ring shape. The first switching circuit 11 selects either of an output LIO<0:7> or an inverting output bLIO<0:7>, which are output from each of the four test registers 12a, 12b, 12c, and 12d. Further, the test latch circuit 12 in FIG. 7 has a multiplexer 15 for selecting either of the output LIO<0:7> or bLIO<0:7>.

The data pattern from the data input/output buffer 9 is input to only one of the test registers through a third switching circuit 16. The input data pattern is shifted to be transferred to other test registers. Various data patterns can be generated by variably controlling the shift amount and using inverting bit patterns, by which it is not necessary to input the data patterns from the outside, and the data input time can be reduced.

The third embodiment is effective, in particular, when it is required, in performing the test, to use the data patterns which are different in each page, for example. This is because it is not necessary to input the data from the outside on each occasion, and desired data patterns can be obtained by shifting the shift register as needed.

In the third embodiment, the column selectors 5 also act as the second switching circuit which supplies the data selected by the first switching circuit 11 to at least two data latch circuits 4.

As stated above, in the third embodiment, the test latch circuit 12 has a shift register formed of registers which are connected in a ring shape. Accordingly, various data patterns can be generated by inputting the required minimum data patterns from the outside and variably controlling the shift amount, by which the data input time can be drastically reduced, and the test time can also be reduced.

In the embodiments stated above, an example that the present invention is applied to a NAND-type flash memory has been explained. The present invention can be applied to not only a NAND-type flash memory but also other various semiconductor memory devices.

Although based on above description, those skilled in the art can figure out additional effects and variations of the present invention, the aspect of the present invention is not limited to the stated each embodiments. Various additions, alterations and partial deletions can be done to the present invention within the conceptualistic thought and purpose of the present invention drawn on the claims and the equivalents.

What is claimed is:

1. A NAND-type flash memory comprising:
   a memory cell array having NAND cells, each having memory cells capable of being rewritten electrically, a drain of one memory cell and a source of the other memory cell neighboring in a first direction being connected to each other, each of the NAND cells being arranged in a second direction;
   a plurality of bit lines, each being provided for each of the NAND cells;
   a plurality of sense amplifiers, each being provided for each of the bit lines;
   a plurality of data latch circuits, each being provided for each of the sense amplifiers, each of the data latch circuits temporarily holding data sent to and received from the corresponding sense amplifier;
   at least one test latch circuit which temporarily holds test data supplied from outside; and
   a data switching circuit which performs control for supplying at least two among the data latch circuits with data held in the test latch circuit.

2. The memory according to claim 1,
   wherein the test latch circuit has a plurality of registers, each being capable of temporarily holding data;
   the data switching circuit includes:
   a first switching circuit which supplies a one selected from the plurality of registers with the test data; and
   a second switching circuit which supplies at least two among the plurality of data latch circuits with the test data held in the register selected by the first switching circuit.

3. The memory according to claim 2,
   wherein each of the plurality of registers temporarily holds data patterns supplied from outside, each of the data patterns being different from each other.

4. The memory according to claim 2, further comprising a column selector arranged between the second switching circuit and the plurality of data latch circuits, the column selector selecting at least two of the plurality of data latch circuits in synchronization with switching operation of the second switching circuit.

5. The memory according to claim 1,
wherein the test latch circuit has a shift register having a plurality of registers capable of temporarily holding data, the plurality of registers being connected in a ring shape; and
the data switching circuit includes:
a first switching circuit which selects one of the plurality of registers in accordance with the number of times shifted by the shift register; and
a second switching circuit which supplies at least two of the plurality of data latch circuits with data held in the register selected by the first switching circuit.

6. The memory according to claim 5,
wherein the data switching circuit has a third switching circuit which supplies one of the plurality of registers with the test data.

7. The memory according to claim 6,
wherein the first switching circuit selects either of the output data of the plurality of registers or inverting data of the output data.

8. The memory according to claim 6,
wherein the test latch circuit has a multiplexer which selects either of the output data or the inverting data; and
the data switching circuit supplies at least two of the plurality of data latch circuits with data selected by the multiplexer.

9. The memory according to claim 5,
wherein the first switching circuit switches the selected register for each page which expresses a unit for writing data into the memory cell array.

10. The memory according to claim 5,
wherein the shift register varies the amount of shift for each page which expresses a unit for writing data into the memory cell array.

11. The memory according to claim 1,
wherein the NAND cells are provided multiple pieces in each of blocks which expresses a unit of a mass erase operation; and
the data switching circuit supplies the data latch circuit which is present at the same position in each block, with the data held in the test latch circuit.

12. The memory according to claim 5,
wherein the memory cell array has a plurality of blocks, each having the plurality of NAND cells arranged in the first direction; and
the second switching circuit supplies two or more the data latch circuits in two or more the blocks with the same data at the same time.

13. The memory according to claim 5,
wherein the memory cell array has a plurality of blocks, each having the plurality of NAND cells arranged in the first direction; and
the second switching circuit supplies the data latch circuit in each of the blocks with the same data by turns.

14. The memory according to claim 1,
wherein the NAND cells are provided multiple pieces in a block which expresses a unit of a mass erase operation, further comprising:
a test control signal generating circuit which controls the data switching circuit based on a first signal indicative of latches of the test data and a second signal indicative of the number of the block to be tested, the first and second signals being supplied from outside.

15. The memory according to claim 1,
wherein the NAND cells are provided multiple pieces in each of blocks which expresses a unit of a mass erase operation; and
the data switching circuit supplies the data latch circuits in at least two of the blocks with data held in the test latch circuit.

16. A semiconductor memory device comprising:
a memory cell array having a plurality of memory cells;
a plurality of bit lines connected to the plurality of memory cells;
a plurality of sense amplifiers, each being provided for each of the bit lines;
a plurality of data latch circuits, each being provided for each of the sense amplifiers, each of the data latch circuits temporarily holding data sent to and received from the corresponding sense amplifier;
at least one test latch circuit which temporarily holds test data supplied from outside; and
a data switching circuit which performs control for supplying at least two among the data latch circuits with data held in the test latch circuit.

17. The device according to claim 16,
wherein the test latch circuit has a plurality of registers, each being capable of temporarily holding data;
the data switching circuit includes:
a first switching circuit which supplies a one selected from the plurality of registers with the test data; and
a second switching circuit which supplies at least two among the plurality of data latch circuits with the test data held in the register selected by the first switching circuit.

18. The device according to claim 16,
wherein the test latch circuit has a shift register having a plurality of registers capable of temporarily holding data, the plurality of registers being connected in a ring shape; and
the data switching circuit includes:
a first switching circuit which selects one of the plurality of registers in accordance with the number of times shifted by the shift register; and
a second switching circuit which supplies at least two of the plurality of data latch circuits with data held in the register selected by the first switching circuit.

19. The device according to claim 18,
wherein the first switching circuit switches the selected register for each page which expresses a unit for writing data into the memory cell array.

20. The device according to claim 16,
wherein the NAND cells are provided multiple pieces in each of blocks which expresses a unit of a mass erase operation; and
the data switching circuit supplies the data latch circuit which is present at the same positions in each block, with the data held in the test latch circuit.

* * * * *